(12) United States Patent
deVilliers et al.

(10) Patent No.: US 10,366,890 B2
(45) Date of Patent: Jul. 30, 2019

(54) METHOD FOR PATTERNING A SUBSTRATE USING A LAYER WITH MULTIPLE MATERIALS

(71) Applicant: Tokyo Electron Limited, Tokyo (JP)

(72) Inventors: Anton J. deVilliers, Clifton Park, NY (US); Nihar Mohanty, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/596,618

(22) Filed: May 16, 2017

(65) Prior Publication Data

US 2017/0338116 A1    Nov. 23, 2017

Related U.S. Application Data

(60) Provisional application No. 62/340,279, filed on May 23, 2016.

(51) Int. Cl.
*H01L 21/033*    (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0338; H01L 21/0337; H01L 21/0332; H01L 21/0335
See application file for complete search history.

(56) References Cited

U.S. PATENT DOCUMENTS

| | | | |
|---|---|---|---|
| 8,213,587 B2 | 7/2012 | Vendrow | |
| 8,492,282 B2 | 7/2013 | DeVilliers | |
| 8,548,143 B2 | 10/2013 | Vendrow | |
| 8,600,391 B2 | 12/2013 | Vendrow et al. | |
| 8,670,545 B2 | 3/2014 | Vendrow | |
| 8,828,876 B2 | 9/2014 | Horak et al. | |
| 8,838,082 B2 | 9/2014 | Vendrow et al. | |
| 8,871,646 B2 | 10/2014 | DeVilliers | |
| 9,084,186 B2 | 7/2015 | Vendrow et al. | |
| 9,123,656 B1 | 9/2015 | Hsieh et al. | |
| 9,209,076 B2 | 12/2015 | Yao et al. | |
| 9,258,673 B2 | 2/2016 | Vendrow et al. | |

(Continued)

FOREIGN PATENT DOCUMENTS

KR    10-2015-0059634 A    6/2015

OTHER PUBLICATIONS

International Search Report and Written Opinion dated Jul. 31, 2017 in PCT/US2017/033051 filed May 17, 2017.

*Primary Examiner* — Thomas T Pham

(74) *Attorney, Agent, or Firm* — Oblon, McClelland, Maier & Neustadt, L.L.P.

(57) ABSTRACT

Techniques herein enable integrating stack materials and multiple color materials that require no corrosive gases for etching. Techniques enable a multi-line layer for self-aligned pattern shrinking in which all layers or colors or materials can be limited to silicon-containing materials and organic materials. Such techniques enable self-aligned block integration for 5 nm back-end-of-line trench patterning with an all non-corrosive etch compatible stack for self-aligned block. Embodiments include using lines of a same material but at different heights to provided etch selectivity to one of several lines based on type of material and/or height of material and etch rate.

15 Claims, 16 Drawing Sheets

(56) References Cited

U.S. PATENT DOCUMENTS

| | | |
|---|---|---|
| 9,508,713 B2 | 11/2016 | He et al. |
| 9,627,206 B2 | 4/2017 | Yao et al. |
| 9,780,193 B2 * | 10/2017 | Lu .................... H01L 29/6656 |
| 2009/0086947 A1 | 4/2009 | Vendrow |
| 2010/0112811 A1 * | 5/2010 | Yeh ................ H01L 21/82382 |
| | | 438/669 |
| 2010/0130016 A1 | 5/2010 | DeVilliers |
| 2010/0130213 A1 | 5/2010 | Vendrow et al. |
| 2010/0183134 A1 | 7/2010 | Vendrow et al. |
| 2012/0021730 A1 | 1/2012 | Vendrow et al. |
| 2012/0021750 A1 | 1/2012 | Vendrow et al. |
| 2013/0016822 A1 | 1/2013 | Vendrow |
| 2013/0309871 A1 | 11/2013 | DeVilliers |
| 2014/0162665 A1 | 6/2014 | Vendrow et al. |
| 2014/0190935 A1 | 7/2014 | Horak |
| 2014/0361352 A1 * | 12/2014 | Hung ................ H01L 21/28008 |
| | | 257/288 |
| 2015/0147882 A1 | 5/2015 | Yao et al. |
| 2015/0255300 A1 | 9/2015 | He et al. |
| 2016/0027776 A1 | 1/2016 | He et al. |
| 2016/0079063 A1 | 3/2016 | Lee et al. |
| 2016/0119853 A1 | 4/2016 | Vendrow et al. |

\* cited by examiner

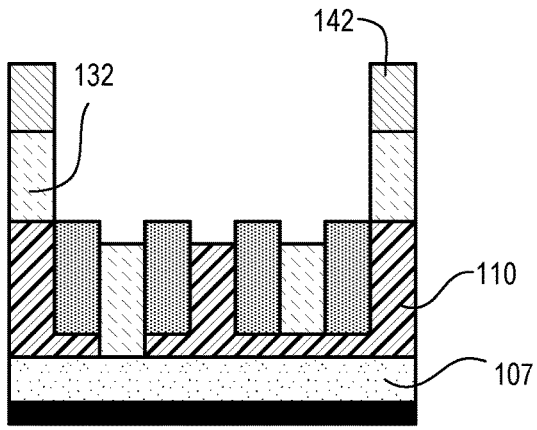 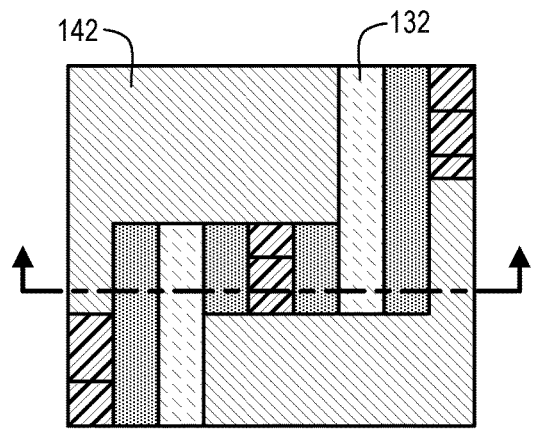
FIG. 28A  FIG. 28B
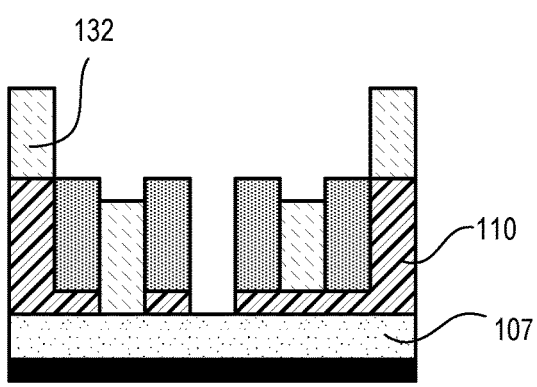 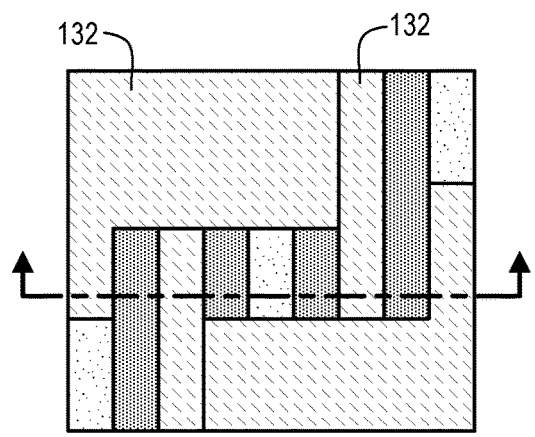
FIG. 29A  FIG. 29B
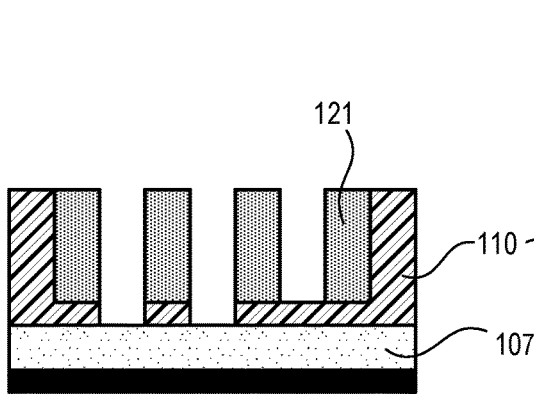 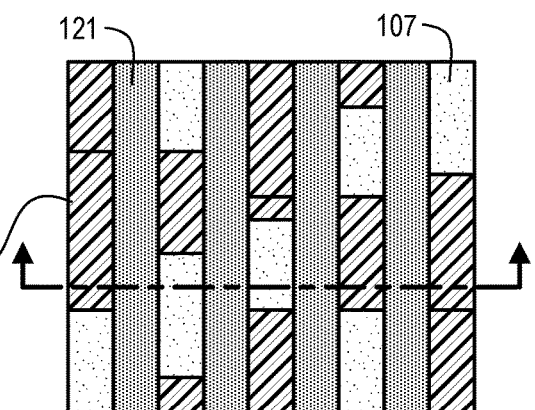
FIG. 30A  FIG. 30B

METHOD FOR PATTERNING A SUBSTRATE USING A LAYER WITH MULTIPLE MATERIALS

CROSS REFERENCE TO RELATED APPLICATIONS

The present application claims the benefit of U.S. Provisional Patent Application No. 62/340,279, filed on May 23, 2016, entitled "Method for Patterning a Substrate Using a Layer with Multiple Materials," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure of actinic radiation through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between the two identical points in two adjacent repetitive features. Half-pitch then is half the distance between identical features of an array.

Pitch reduction techniques, often somewhat erroneously yet routinely termed "pitch multiplication" as exemplified by "pitch doubling" etc., can extend the capabilities of photolithography beyond feature size limitations (optical resolution limitations). That is, conventional multiplication of pitch (more accurately pitch reduction or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP) has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photolithography systems.

In order to maintain the pitch scaling, back-end-of-line (BEOL) trench patterning at node 7 and beyond, demands sub-36 nm pitch. While patterning this small pitch can be challenging, it can be achieved by a variety of methods including EUV 13.5 nm lithography self-aligned double patterning (SADP), 193 nm self-aligned quadruple patterning (SAQP) or via directed self-assembly (DSA). A key step in the trench patterning process is area selective blocking process where the infinite lines are cut into chains or line ends cut, et cetera, to form the final desired trench layout. As the pitches get smaller, the overlay requirements of this block pattern go beyond the capability of the lithographic tools, which can prevent continued pitch scaling in the BEOL.

Techniques disclosed herein provide a method for pitch reduction (increasing pitch/feature density) for creating high-resolution features and also for cutting on pitch of sub-resolution features. Techniques herein enable integrating stack materials and different "color" materials that require no corrosive gases for etching. Embodiments can include that all layers or colors or materials (different etch resistivities) can be limited to silicon-containing materials and organic materials. Such techniques enable self-aligned block integration for 5 nm back-end-of-line trench patterning with an all non-corrosive etch compatible stack for self-aligned block. Self-aligned blocking removes unmanageable overlay requirements of direct lithographic/block pattern, and replaces the lithographic challenge with an etch selectivity challenge. A multi-line layer with lines of different colors (materials with different etch resistivities) is used to further narrow or reduce openings in lithographic patterns. Lines of different colors can be achieved herein using lines of differing heights of a same material.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A-18A are cross-sectional side views of an example substrate segment showing a process flow according to embodiments disclosed herein.

FIGS. 1B-18B are top views of corresponding example substrate segment from FIGS. 1A-18A according to embodiments disclosed herein. The dotted sectional line indicates the cross section for corresponding cross-sectional side views.

FIGS. 19A-32A are cross-sectional side views of an example substrate segment showing a process flow according to embodiments disclosed herein.

FIGS. 19B-32B are top views of corresponding example substrate segment from FIGS. 19A-32A according to embodiments disclosed herein. The dotted sectional line indicates the cross section for corresponding cross-sectional side views.

FIGS. 33A-46A are cross-sectional side views of an example substrate segment showing a process flow according to embodiments disclosed herein.

FIGS. 33B-46B are top views of corresponding example substrate segment from FIGS. 33A-46A according to embodiments disclosed herein. The dotted sectional line indicates the cross section for corresponding cross-sectional side views.

DETAILED DESCRIPTION

Techniques disclosed herein provide a method for pitch reduction (increasing pitch/feature density) for creating high-resolution features and also for cutting on pitch of sub-resolution features. Techniques herein enable integrating stack materials and multiple color materials that require no corrosive gases for etching. Embodiments can include that all layers or colors or materials (materials of different etch resistivities) can be limited to silicon-containing materials and organic materials. Such techniques enable self-aligned block integration for 5 nm back-end-of-line trench patterning with an all non-corrosive etch compatible stack for self-aligned block. For some fabrication processes it is desired to limit corrosive etches because it is possible for corrosive etching to cause defectivity. Example non-corrosive chemistries for etching include elements or compounds that do not contain chlorine, bromine, or iodine. Self-aligned block refers to the technique, also invented by the inventor, of using multiple lines of different materials to realize sub-resolution patterning. An etch mask with at-resolution (or larger) openings is formed over or under such a multi-line layer, then one or more of the particular lines of material is selectively etched to further narrow or shrink what is defined by the etch mask.

Figure 1A:
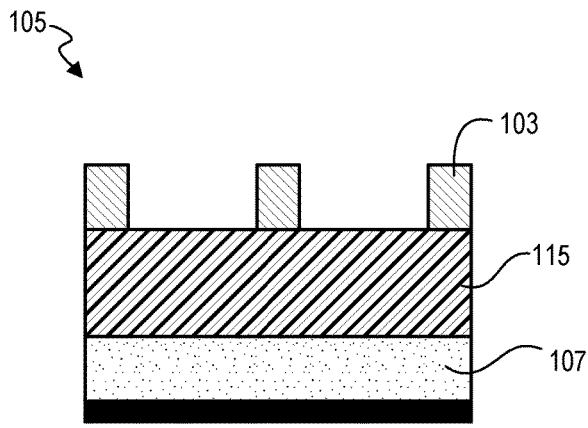
Figure 1B:
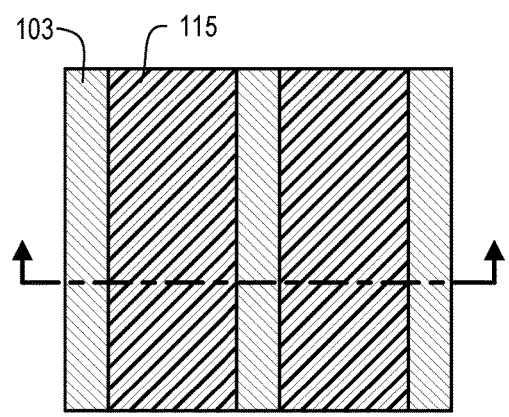

One embodiment includes a method for patterning a substrate. FIGS. 1A-18A and 1B-18B illustrate one example flow. Referring now to FIGS. 1A and 1B, a substrate 105 is provided that has a mandrel layer 115 positioned on a target layer 107. Note that one or more films can be positioned between mandrel layer 115 and target layer 107. A photoresist mandrel mask or etch mask 103 is formed on the mandrel layer 115 (layer from which mandrels will be formed). Note that the photoresist mandrel mask can include any additional intermediate layers such as a planarization layer, anti-reflective coating layer, et cetera, and so the etch mask 103 itself may not be in direct contact with the mandrel layer 115. In these and subsequent drawings, figures with an "A" in the figure reference depict cross-sectional side views of an example substrate segment being processed, while figures with a "B" in the figure reference depict top views of the same substrate segment with a dashed cut line to show where the corresponding cross-sectional side view is made. Note that for convenience in identifying materials, the top views use similar hatching lines for materials as in the cross-sectional views even though the top views do not depict a cross section but instead show top surfaces.

Figure 2A:
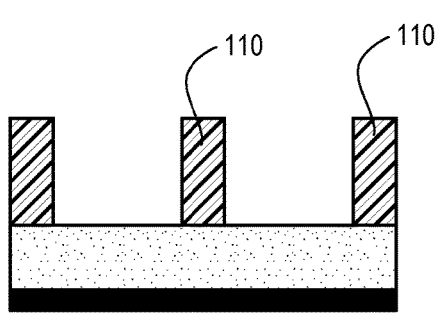
Figure 2B:
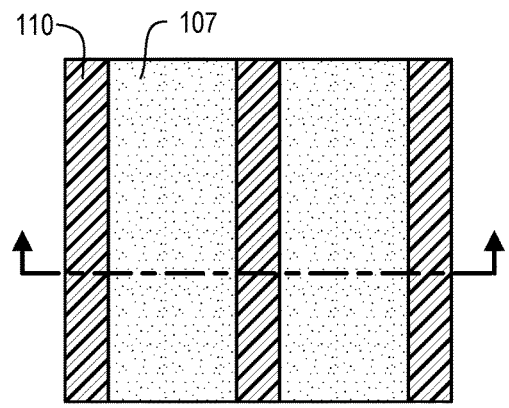

Using the etch mask 103, mandrels 110 are formed on the target layer of the substrate, such as with a directional or anisotropic etch. The mandrels 110 are comprised of a first material, while the target layer is comprised of a third material. FIGS. 2A and 2B illustrate an example result.

Figure 3A:
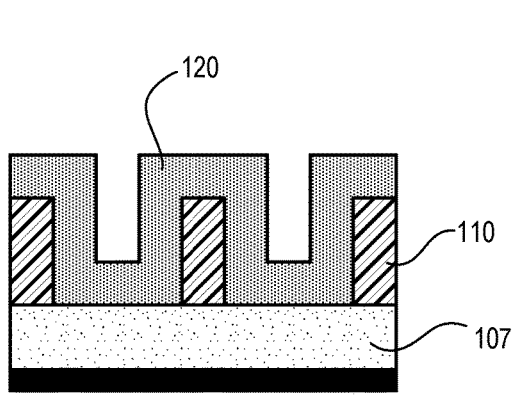
Figure 3B:
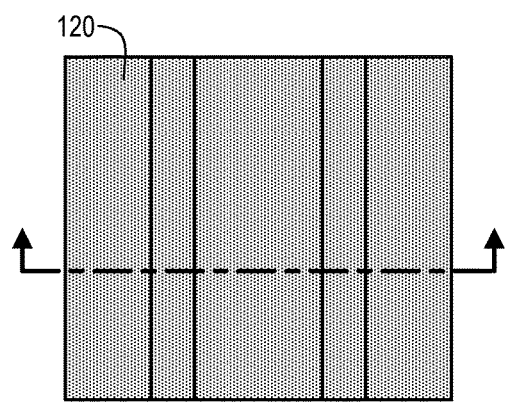

Next, sidewall spacers 121 are formed on mandrels 110. Sidewall spacers can be formed by depositing a conformal film 120 on the substrate 105. FIGS. 3A and 3B show an example result of such a conformal deposition. Note that such a film is deposited having a generally uniform thickness on both horizontal and vertical surfaces. Portions of the conformal film above top surfaces of mandrels 110 are removed while leaving conformal film below top surfaces of the mandrels 110 such that sidewall spacers 121 are formed on vertical sidewalls of the mandrels 110, and such that the conformal film covers the target layer 107 between adjacent sidewall spacers. This conformal film is comprised of the second material.

Figure 4A:
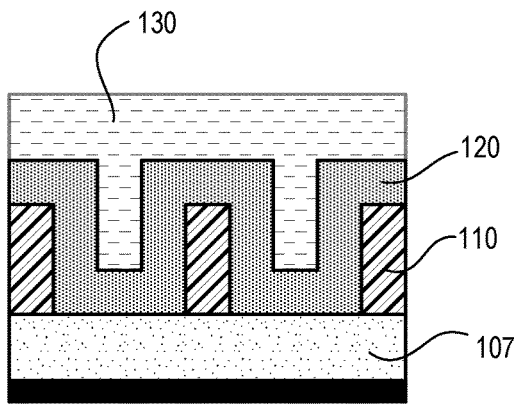
Figure 4B:
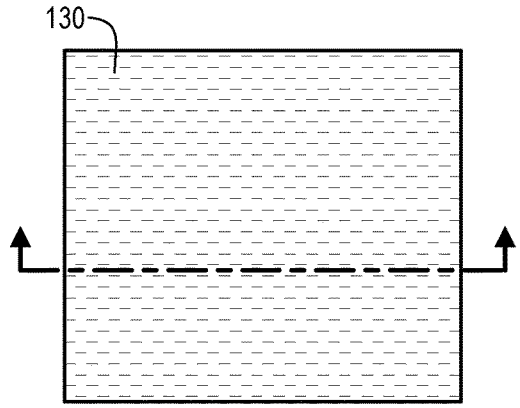
Figure 5A:
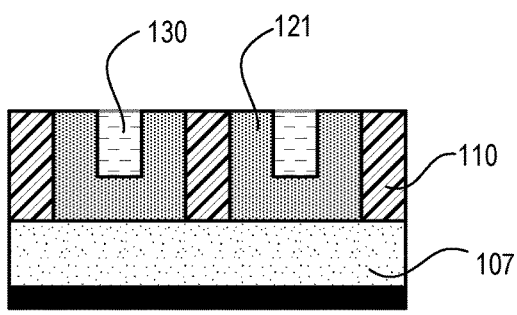
Figure 5B:
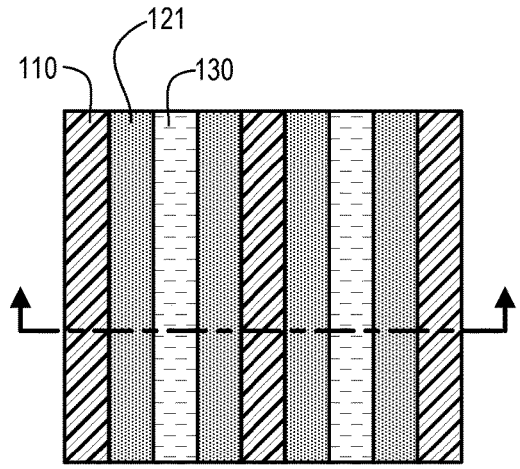

There are various techniques to remove top surfaces of the conformal film. In one alternative, a fill material 130 is deposited on the substrate. The fill material fills trenches defined by the conformal film, and typically has an over burden of material. FIGS. 4A and 4B illustrate an example result. Then a chemical-mechanical polishing (CMP) step can be executed that removes conformal film material and fill material 130 above top surfaces of the mandrels 110. FIGS. 5A and 5B show an example result. Note that the substrate is planarized to top surfaces of the mandrels 110, while leaving plugs of fill material 130 in trenches defined by the sidewall spacers 121.

Figure 6A:
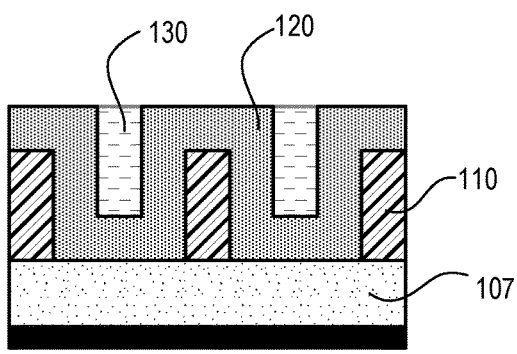
Figure 6B:
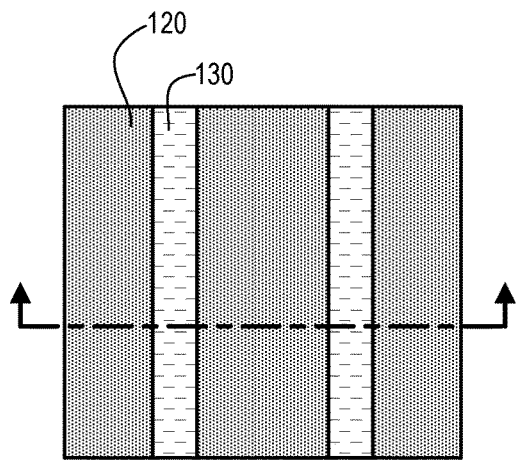
Figure 7A:
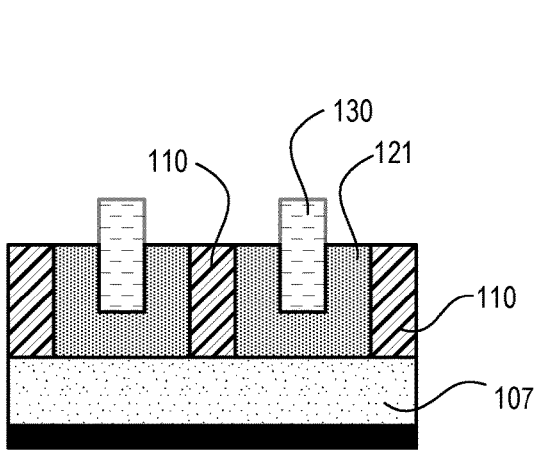
Figure 7B:
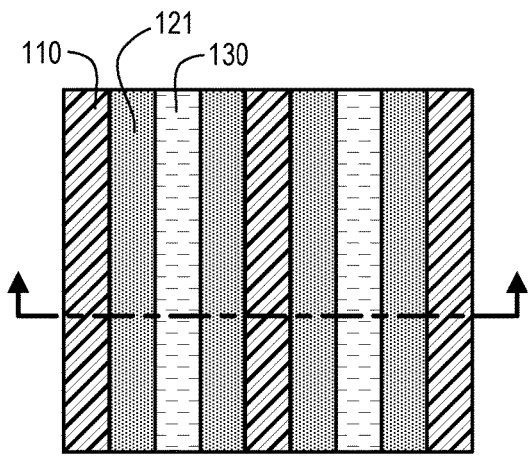
Figure 8A:
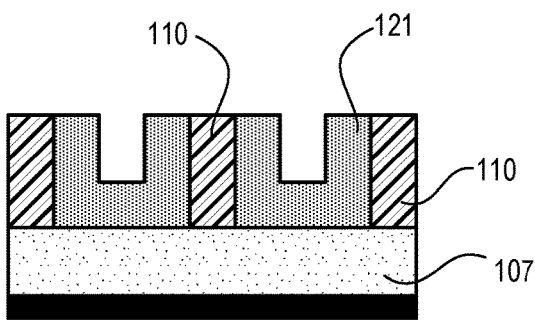
Figure 8B:
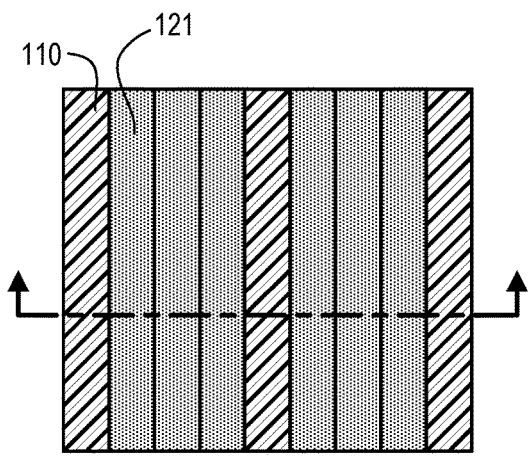

An alternative technique for removing top surfaces of the conformal film is etch-based. A partial etch of the fill material 130 can be executed to uncover top surfaces of conformal film 120. An example result is illustrated in FIGS. 6A and 6B. For example, a plasma-based dry etch can be executed based on time or end point detection. Another option is a wet etch with a diffusion-limited solubility shift of the top portion of fill material 130 if fill material 130 is capable of solubility shifts (developable). After uncovering top surfaces of the conformal film 120, a spacer open etch can be executed to partially etch the conformal film until uncovering top surfaces of mandrels 110. This leaves sidewall spacers 121 on mandrels 110. Conformal film material still covers target layer 107 between sidewall spacers 121 because plugs of fill material 130 prevented this floor portion from being etched. An example result is illustrated in FIGS. 7A and 7B. After completing this spacer open etch, the remaining fill material 130 can be removed, as shown in FIGS. 8A and 8B. A multi-line layer has then been created, but with part of the spacer material covering target layer 107 instead of being open or covered with a different material.

Figure 9A:
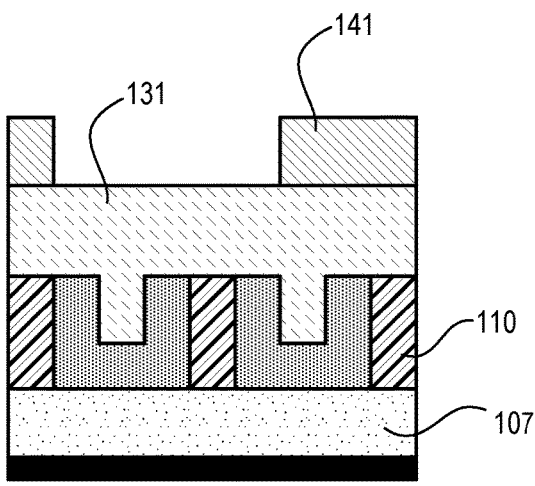
Figure 9B:
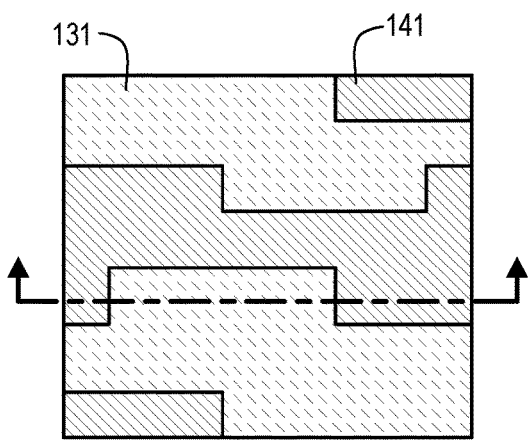

Referring now to FIGS. 9A and 9B, a first etch mask 141 is formed on the substrate. Fill material 131 can be deposited on the substrate prior to forming the etch mask as a planarization layer. The first etch mask 141 defines openings that uncover regions of both the first material (mandrels 110) and the second material (sidewall spacers 121). The first material and the second material have different etch resistivities relative to each other. This means that for one or more particular etch chemistries, one of these materials can be selectively etched while the other material is not etched, which means that either no etching occurs or an insubstantial amount is etched of one material compared to the other material, such as by having an etch rate that is four or more times slower. Although only two types of materials are seen from a top view through the etch mask, because of differing heights of the sidewall spacers and the conformal film in between sidewall spacers, this height disparity effectively provides three lines of material so that the etch mask 141 can be further narrowed by three alternating lines of material for etch location selection, but only two types of material based on etch chemistries needed. Both of those two materials can be selected to be etchable using a non-corrosive etch chemistry.

Figure 10A:
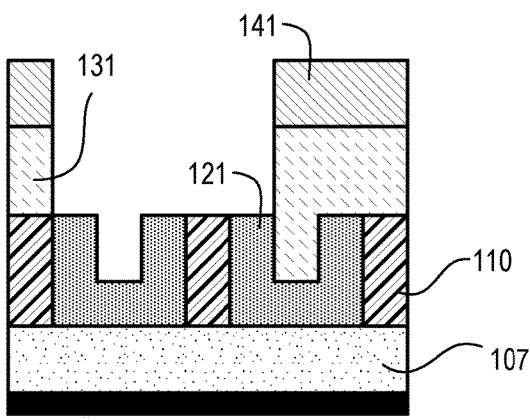
Figure 10B:
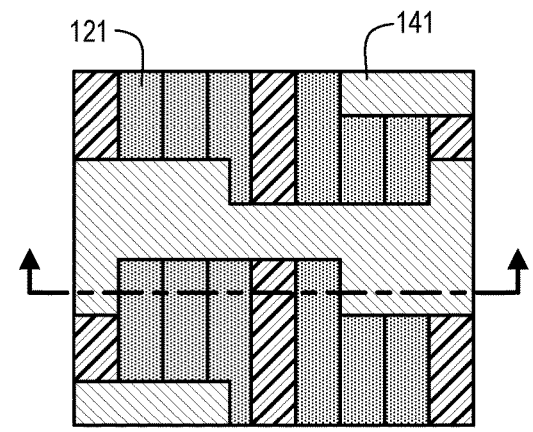
Figure 11A:
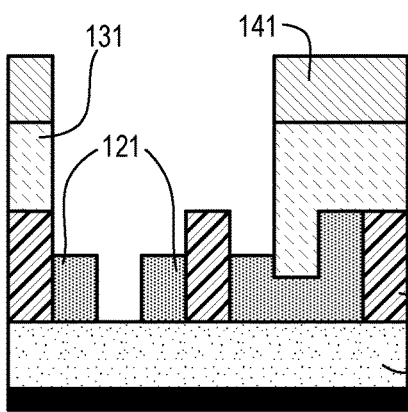
Figure 11B:
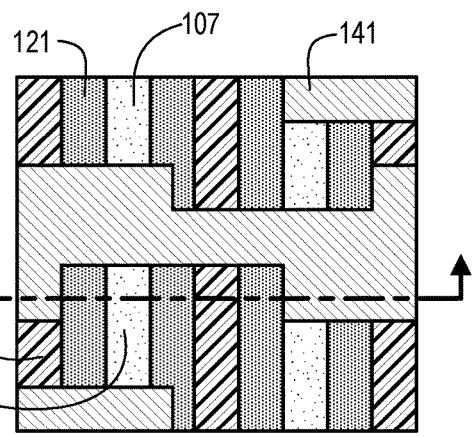

With etch mask 141 in place on the substrate, uncovered portions of fill material 131 can be removed, such as by directional etching. Removing this portion of fill material 131 uncovers mandrels 110 and sidewall spacers 121. FIGS. 10A and 10B show the substrate after this step.

Figure 12A:
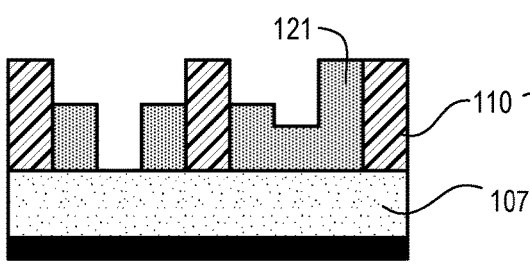
Figure 12B:
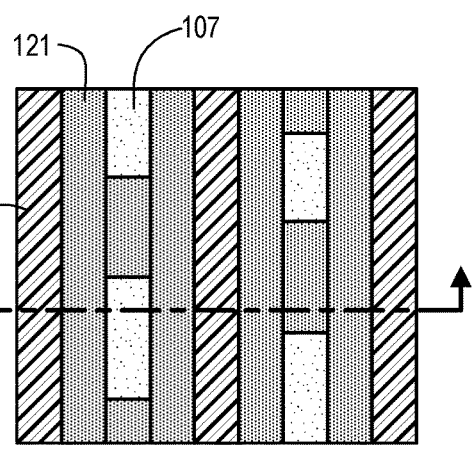

A first etch process is executed that selectively etches uncovered portions of the second material until the conformal film covering the target layer 107 between adjacent sidewall spacers 121 is removed while the sidewall spacers 121 remain on the substrate. An example result in illustrated in FIGS. 11A and 11B. Note that portions of target layer 107 are now visible from above, which means these portions are now uncovered. Note also that this first etch process shortens the height of sidewall spacers 121. Fill material 131 and etch mask 141 can then be removed, as shown in FIGS. 12A and 12B.

Figure 13A:
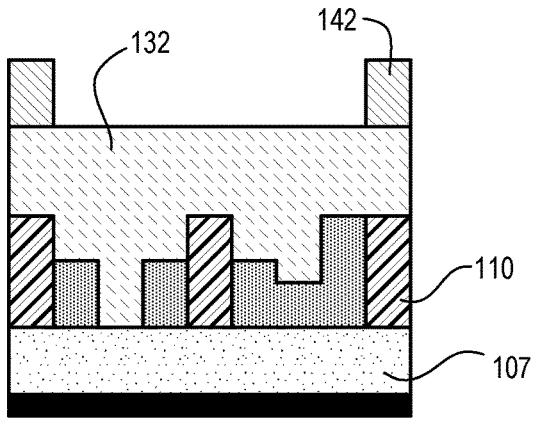
Figure 13B:
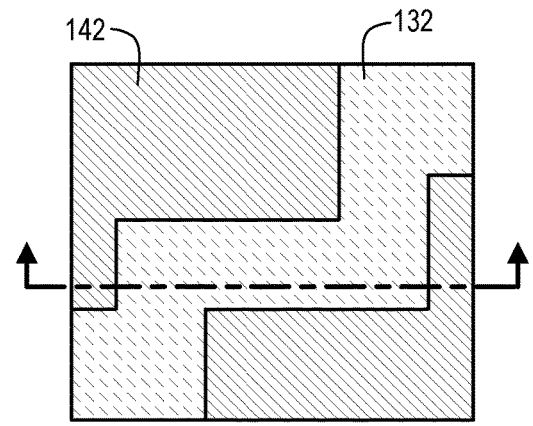

Referring now to FIGS. 13A and 13B, a second etch mask 142 is formed on the substrate. Fill material 132 can be deposited on the substrate prior to forming the etch mask. The second etch mask 142 defines openings that uncover regions of both the first material (mandrels 110) and the second material (sidewall spacers 121). The first material and the second material have different etch resistivities relative to each other.

Figure 14A:
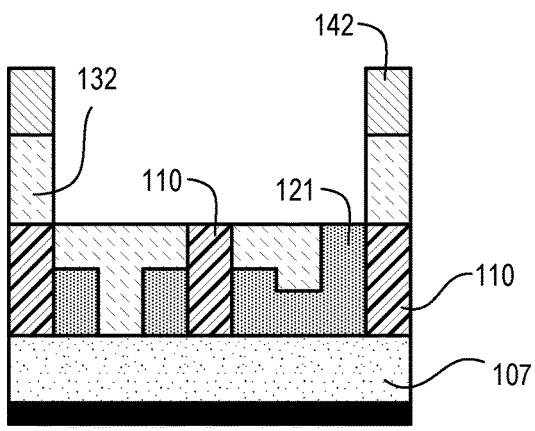
Figure 14B:
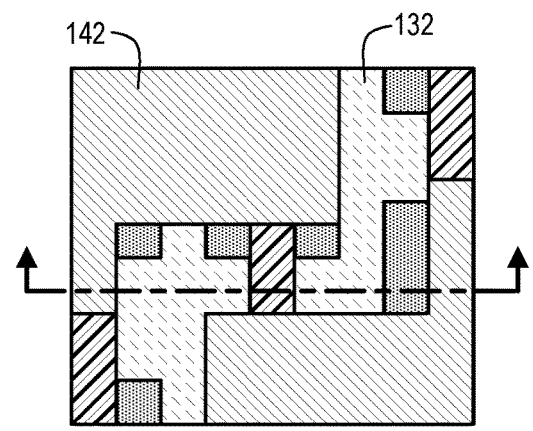
Figure 15A:
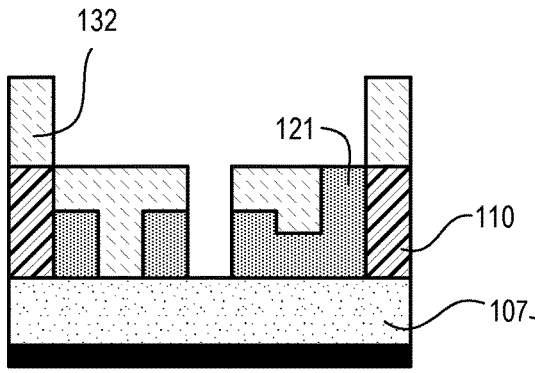
Figure 15B:
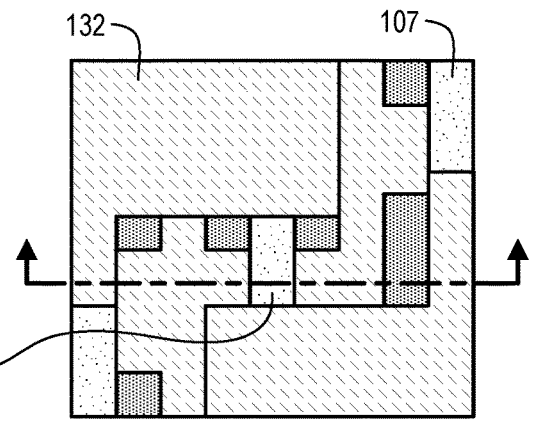

With etch mask 142 in place on the substrate, uncovered portions of fill material 132 can be removed, such as by directional etching. Removing this portion of fill material 132 uncovers mandrels 110 and sidewall spacers 121. FIGS. 14A and 14B show the substrate after this step.

Figure 16A:
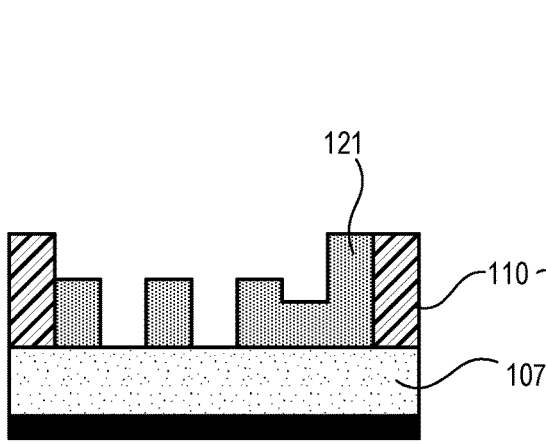
Figure 16B:
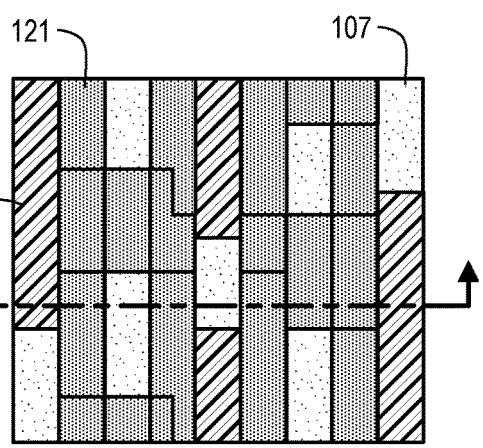

A second etch process is executed that selectively etches uncovered portions of the first material until uncovered mandrels 110 are removed. An example result in illustrated in FIGS. 15A and 15B. Note that portions of target layer 107 are now visible from above, which means these portions are now uncovered. Fill material 132 and etch mask 142 can then be removed, as shown in FIGS. 16A and 16B.

Figure 17A:
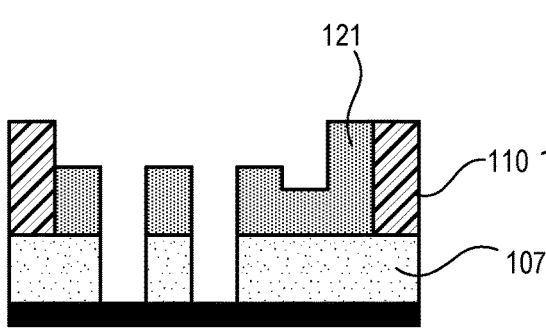
Figure 17B:
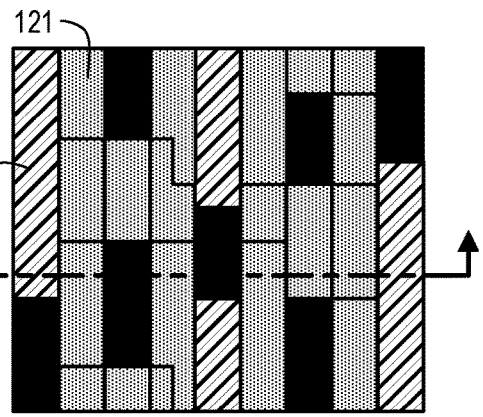
Figure 18A:
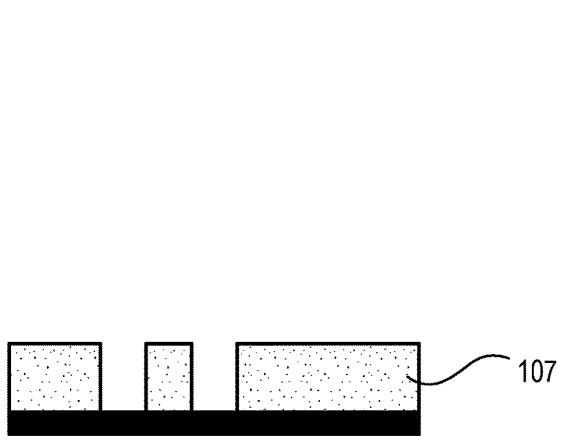
Figure 18B:
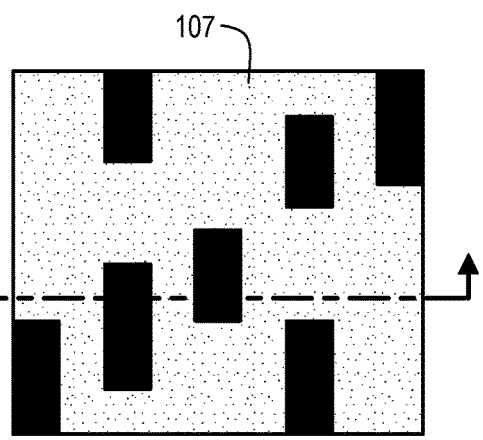

The remaining portions of the mandrels, the sidewall spacers, and the conformal film covers the target layer between adjacent sidewall spacers, together form a combined relief pattern, which can be used as an etch mask to transfer into target layer 107 or other memorization layer. FIGS. 17A and 17B illustrate a result of etching uncovered portions of the target layer 107. FIGS. 18A and 18B then show a patterned target layer 107 after completing pattern transfer. Accordingly, features can be created that are sub-resolution and formed without corrosive etches.

Figure 19A:
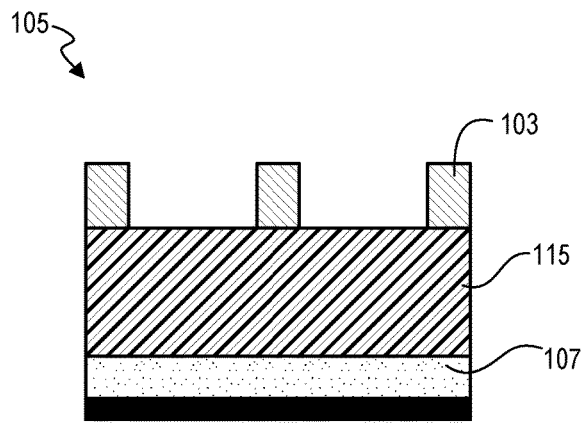
Figure 19B:
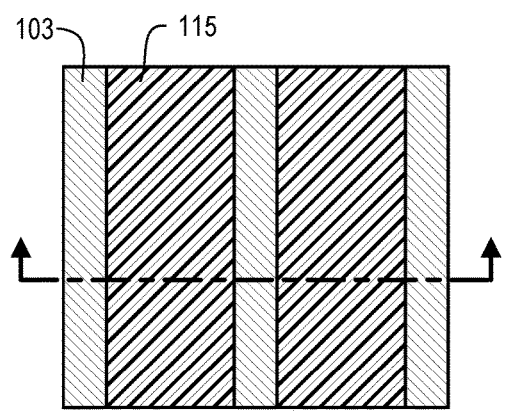

FIGS. 19A-32A and 19B-32B illustrate another example embodiment. Referring now to FIGS. 19A and 19B, a substrate 105 is provided that has a mandrel layer 115 positioned on a target layer 107. Note that one or more films can be positioned between mandrel layer 115 and target layer 107. A photoresist mandrel mask or etch mask 103 is formed thereon on the mandrel layer.

Figure 20A:
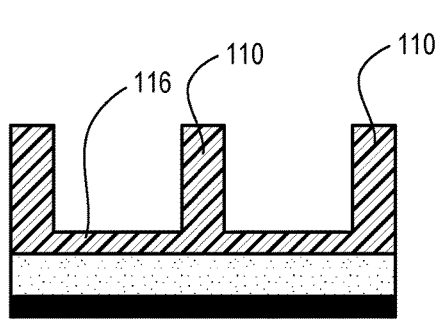
Figure 20B:
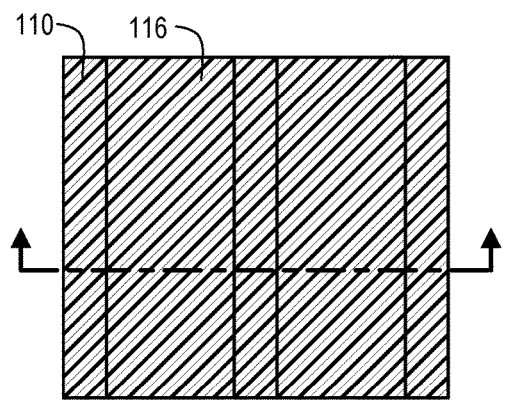

Mandrels 110, are then formed on the target layer 107 of the substrate. The mandrels are comprised of a first material, while the target layer is comprised of a third material. A film of the first material 116 covers the target layer between the mandrels such that a top surface of the mandrels 110 is greater in height as compared to a top surface of the film of the first material. This height difference is at least two times a thickness of the film of the first material 116. This is illustrated in FIGS. 20A and 20B. Such mandrels can be formed by partially etching through a layer of first material, without completely etching through the layer of first material. This partial etch essentially leaves a relatively small thickness of first material over the target layer as part of the process of forming mandrels 110.

Figure 21A:
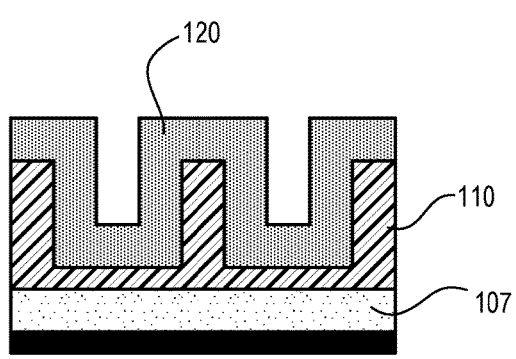
Figure 21B:
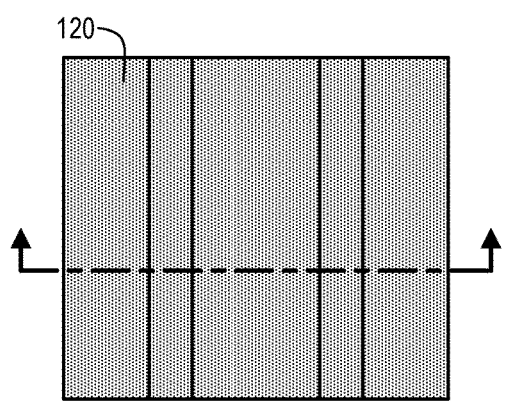
Figure 22A:
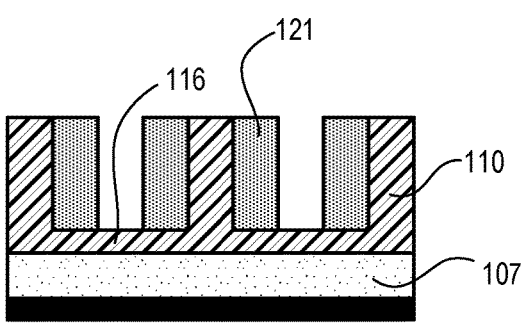
Figure 22B:
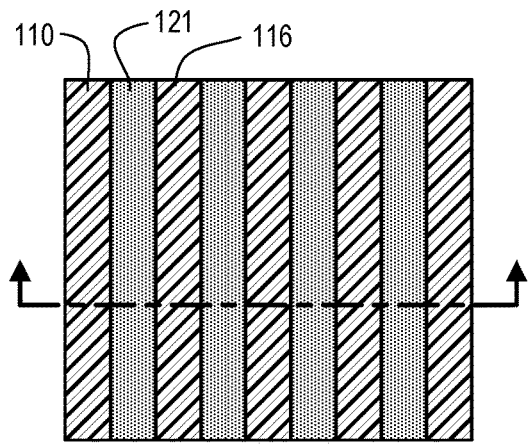

A conformal film 120 can then be deposited on the substrate, as shown in FIGS. 21A and 21B. A spacer open etch can be performed to form sidewall spacers 121 as shown in FIGS. 22A and 22B. The sidewall spacers 121 are comprised of a second material. The sidewall spacers 121 define open spaces between each other that leave the film of the first material 116 uncovered.

Figure 23A:
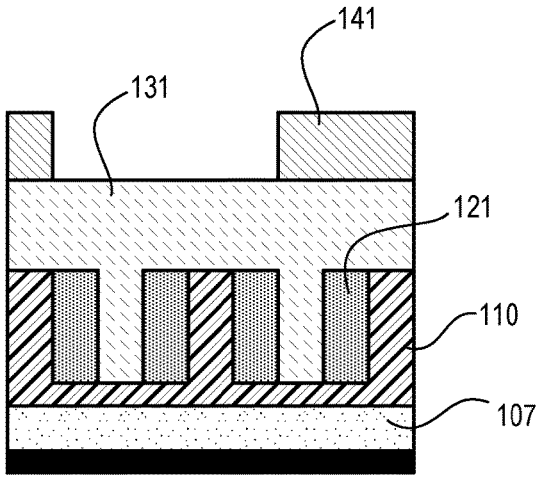
Figure 23B:
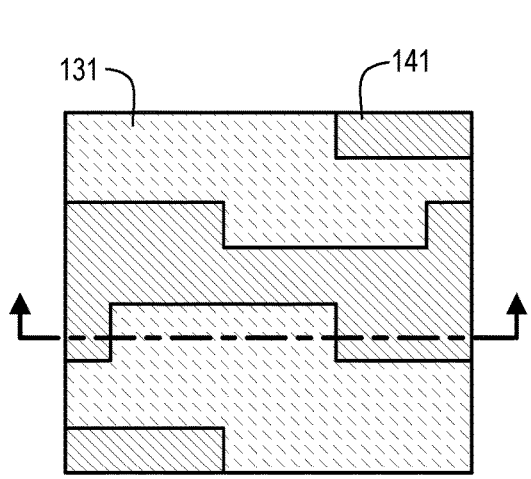
Figure 24A:
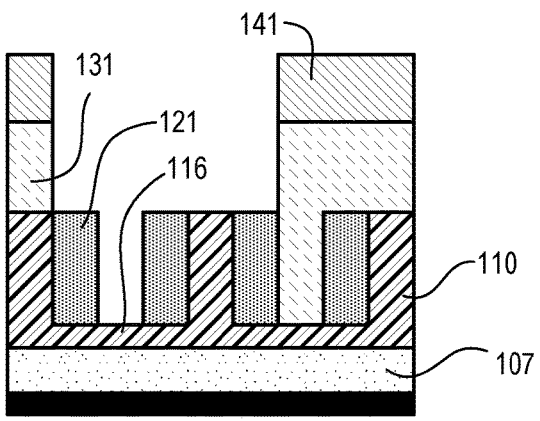
Figure 24B:
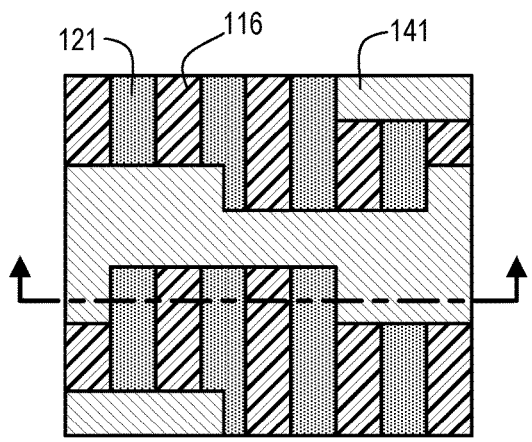
Figure 25A:
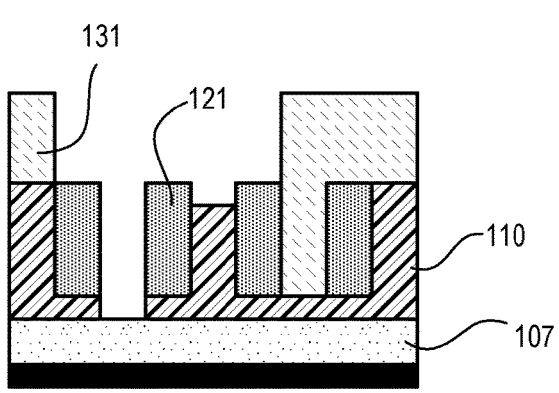
Figure 25B:
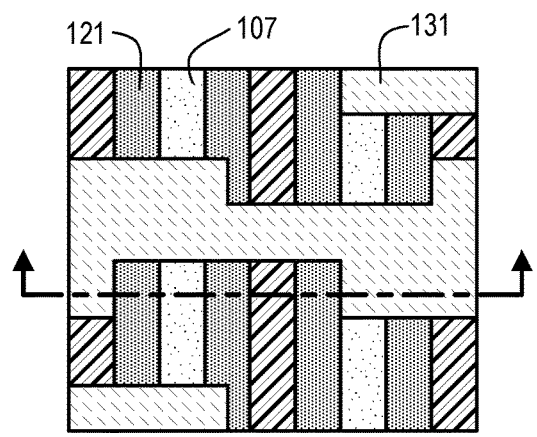
Figure 26A:
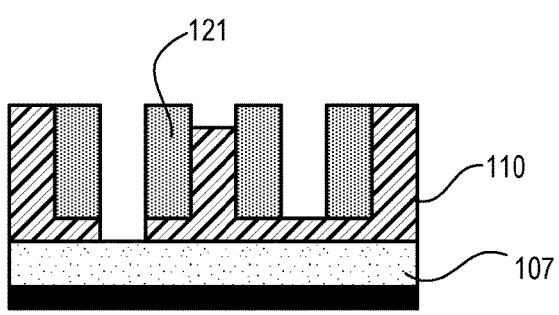
Figure 26B:
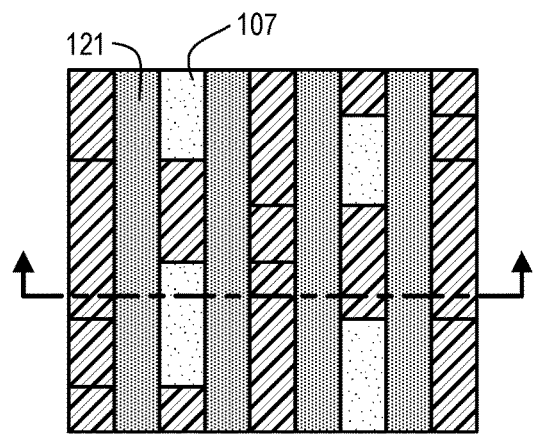

The substrate can be planarized with fill material 131, and then have a first etch mask 141 formed thereon, as in FIGS. 23A and 23B. Uncovered fill material 131 can be etched to uncover the multi-line layer as shown in FIGS. 24A and 24B. Next, optionally, uncovered film of the first material 116 can be etched until the target layer 107 is uncovered. Note that uncovered mandrels will also be etched a same amount/rate as the film of the first material and so these uncovered mandrels will be reduced in height, but still have sufficient height to cover the substrate. FIGS. 25A and 25B show an example result. Remaining fill material 132 and etch mask materials can be removed, as shown in FIGS. 26A and 26B.

Figure 27A:
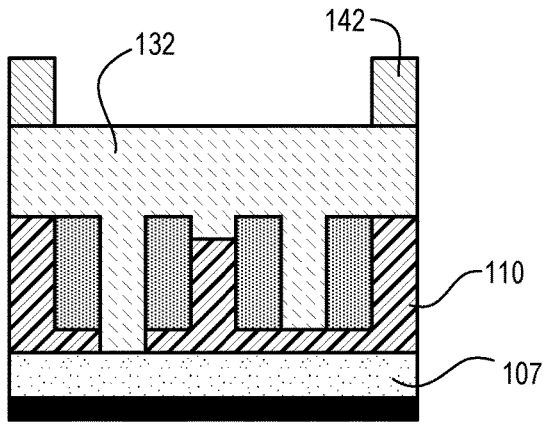
Figure 27B:
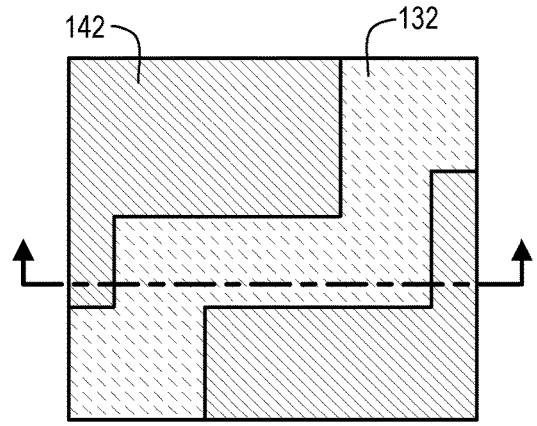

The substrate can be planarized with fill material 132, and then have a second etch mask 142 formed thereon, as in FIGS. 27A and 27B. Uncovered fill material 132 can be etched to uncover the multi-line layer as shown in FIGS. 28A and 28B. Next, optionally, uncovered mandrels 110 can be etched until the target layer 107 is uncovered. FIGS. 29A and 29B show an example result. Remaining fill material 132 and etch mask materials can be removed, as shown in FIGS. 30A and 30B.

Figures 31A, 31B:
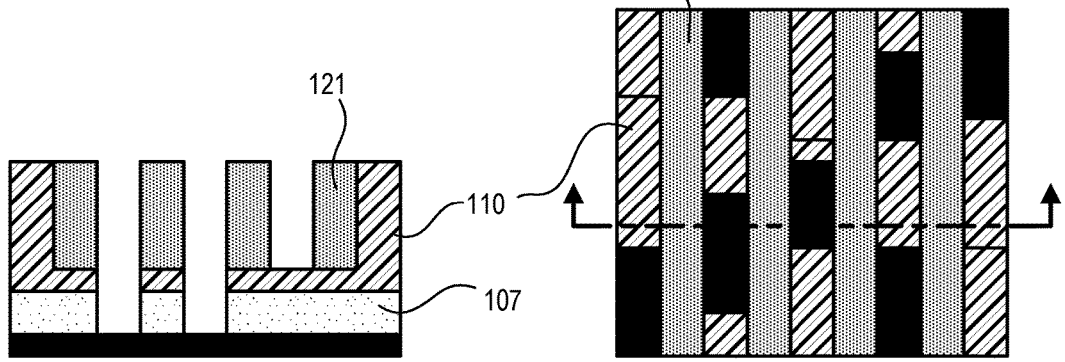
Figures 32A, 32B:
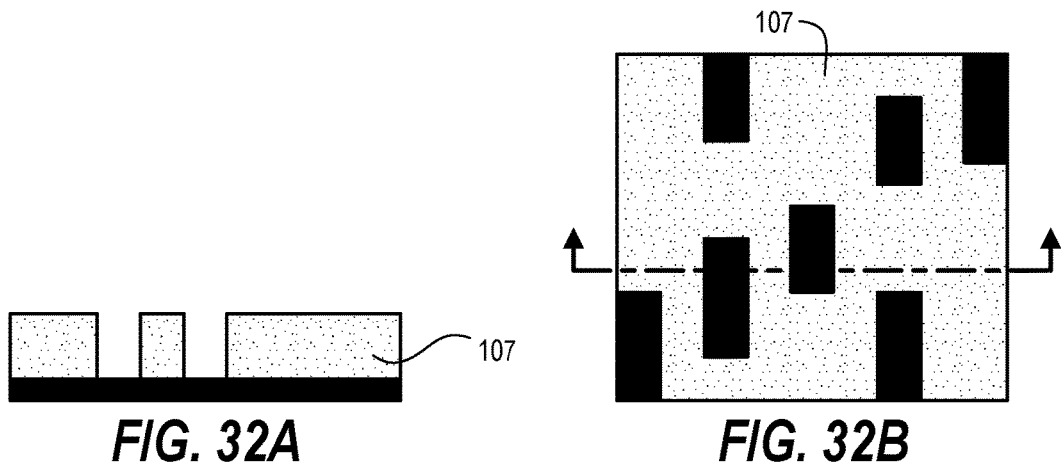

The remaining portions of the mandrels, the sidewall spacers, and the film of the first material, together form a combined relief pattern, which can be used as an etch mask to transfer into target layer 107 or other memorization layer. FIGS. 31A and 31B illustrate a result of etching uncovered portions of the target layer 107. FIGS. 32A and 32B then show a patterned target layer 107 after completing pattern transfer.

Figure 33A:
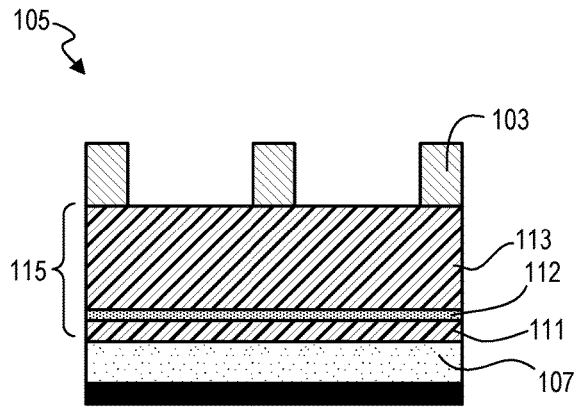
Figure 33B:
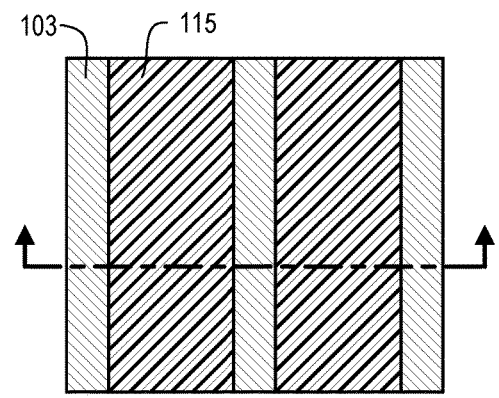

FIGS. 33A-46A and 33B-46B illustrate another example embodiment. Referring now to FIGS. 33A and 33B, a substrate 105 is provided that has a mandrel layer 115 positioned on a target layer 107. A photoresist mandrel mask or etch mask 103 is formed thereon on the mandrel layer. Mandrel layer 115 can be formed as a tri-layer stack on the target layer 107. The tri-layer stack includes a bottom layer 111, an intermediate layer 112, and an upper layer 113, with each layer being deposited as a horizontal and homogeneous layer. The upper layer 113 is comprised of a first material, the intermediate layer 112 is comprised of a fifth material, the bottom layer 111 is comprised of a sixth material, and the target layer 107 is comprised of a third material.

Figure 34A:
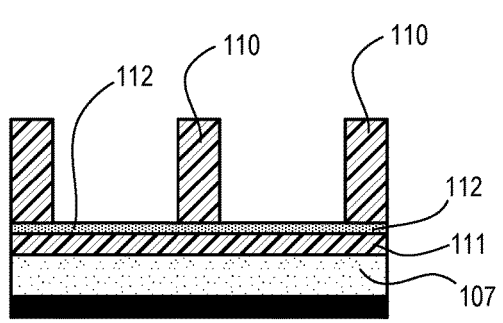
Figure 34B:
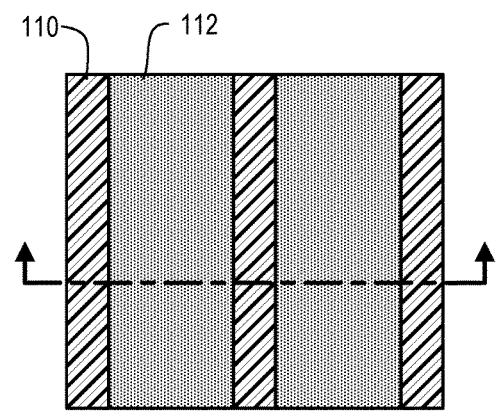

Mandrels 110, are then formed on the target layer 107 of the substrate and are comprised of the first material by using a etch mask 103 and executing a first etch process that etches a mandrel pattern into the upper layer 113 until uncovering the intermediate layer 112. The intermediate layer has a different etch resistivity as compared to the upper layer such that the intermediate layer provides an etch stop layer for the etch process to form mandrels. FIGS. 34A and 34B show an example result.

Figure 35A:
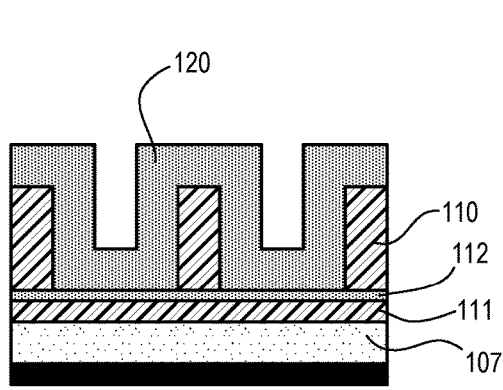
Figure 35B:
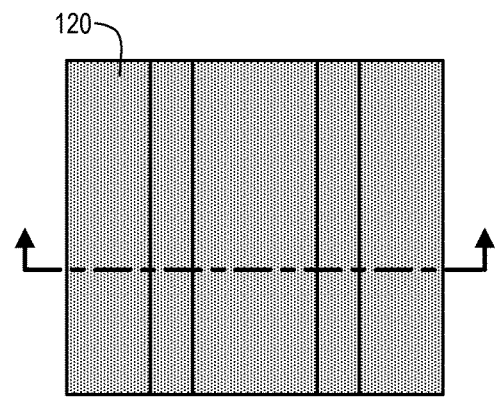
Figure 36A:
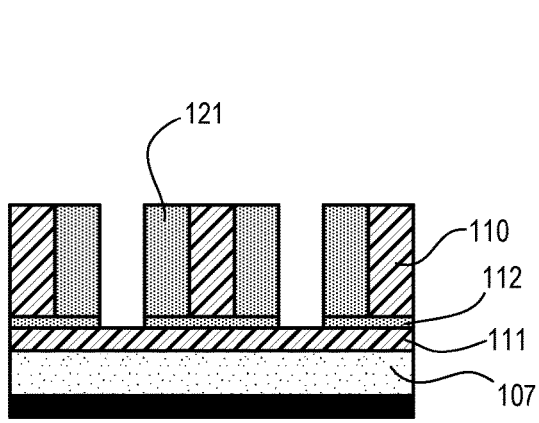
Figure 36B:
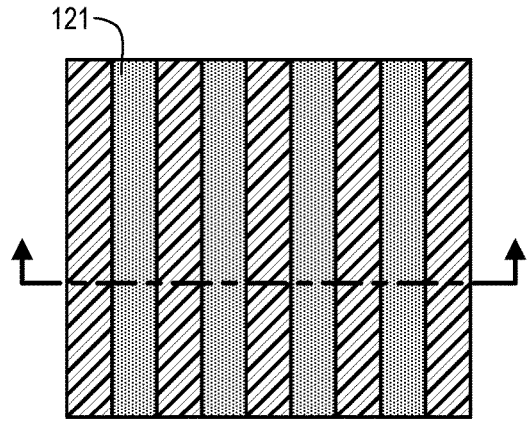

A conformal film 120 can then be deposited on the substrate, as shown in FIGS. 35A and 35B. A spacer open etch can be performed to form sidewall spacers 121 as shown in FIGS. 36A and 36B. The sidewall spacers 121 are comprised of a second material. The sidewall spacers define open spaces between each other that leave the bottom layer 111 uncovered. Note that different etch chemistries can be used to etch conformal film 120 and intermediate layer 112. Alternatively, conformal film 120 and intermediate layer 112 can be a same material or have a same etch resistivity to be able to etch both materials with a same etch chemistry.

Figure 37A:
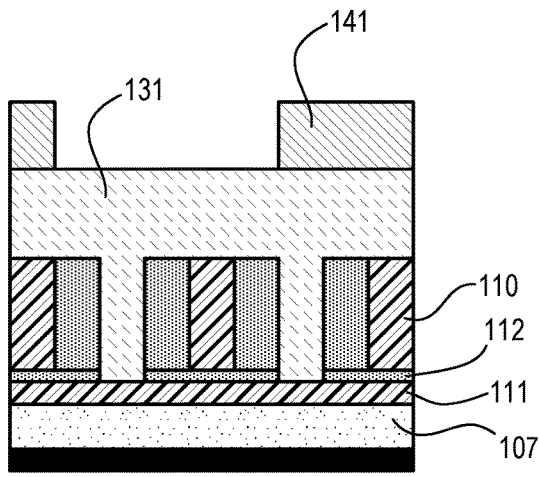
Figure 37B:
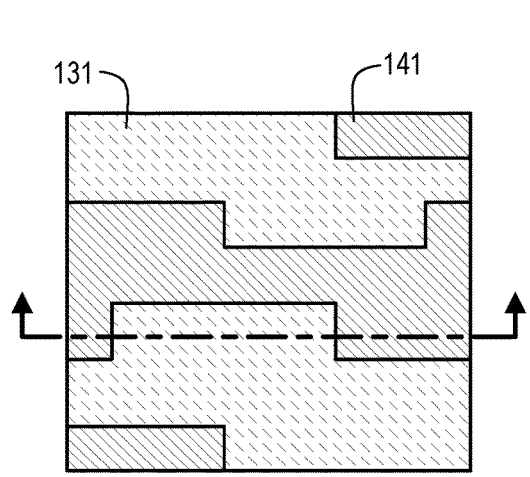
Figure 38A:
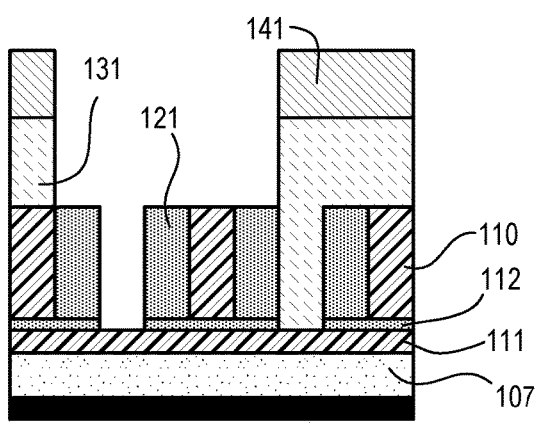
Figure 38B:
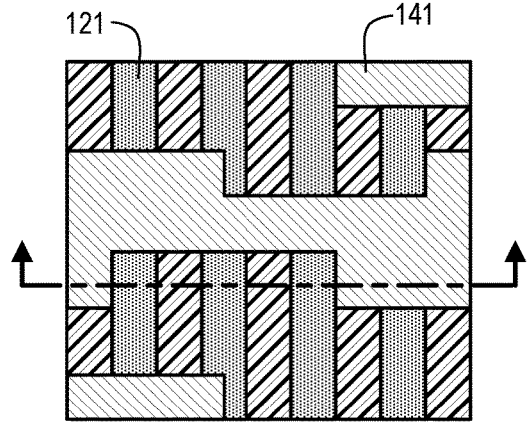
Figure 39A:
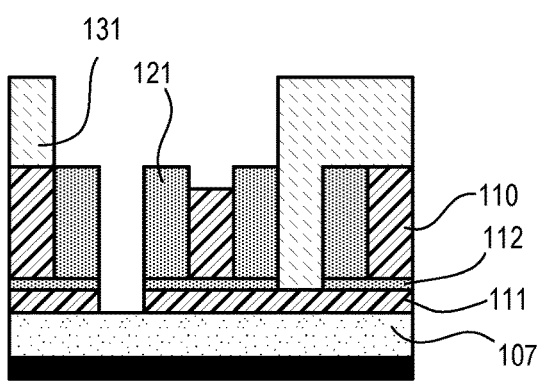
Figure 39B:
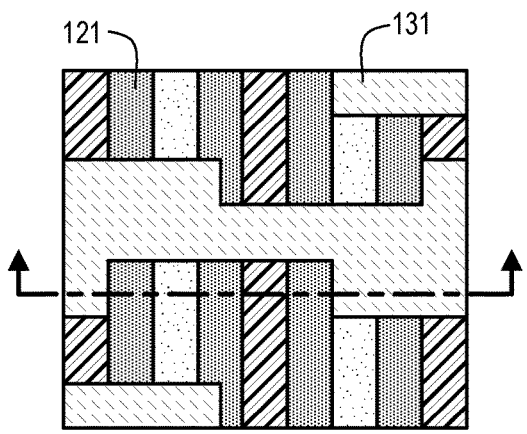
Figure 40A:
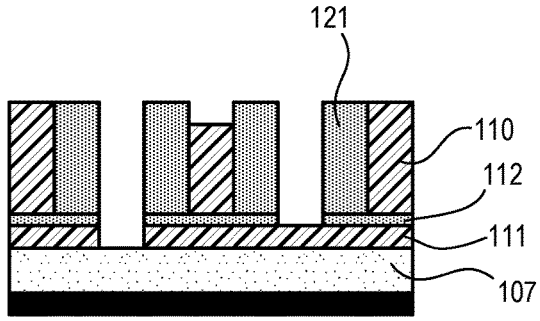
Figure 40B:
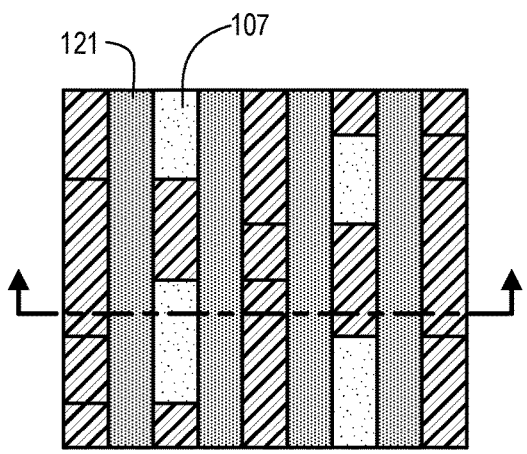

The substrate can be planarized with fill material 131, and then have a first etch mask 141 formed thereon, as in FIGS. 37A and 37B. Uncovered fill material 131 can be etched to uncover the multi-line layer as shown in FIGS. 38A and 38B. Next, optionally, uncovered portions of the bottom layer 111 can be etched until the bottom layer 111 covering the target layer between adjacent sidewall spacers is removed while the sidewall spacers remain on the substrate. A result is illustrated in FIGS. 39A and 39B. Note that uncovered mandrels can also be etched a same amount as the bottom layer if both materials have a same etch resistivity. Remaining fill material 132 and etch mask materials can be removed, as shown in FIGS. 40A and 40B.

Figure 41A:
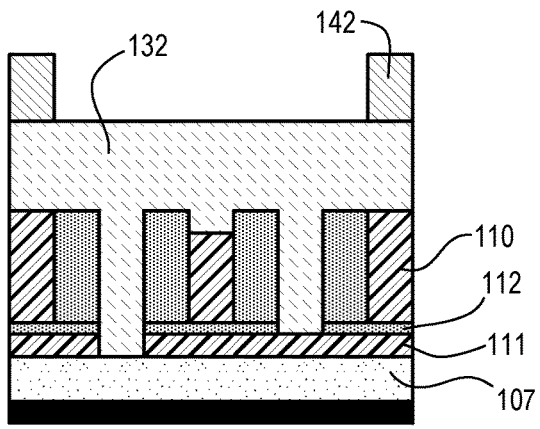
Figure 41B:
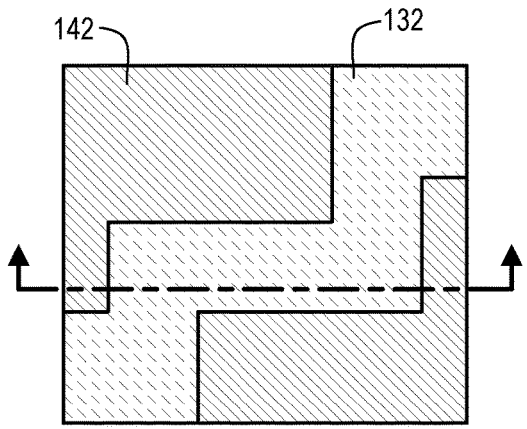
Figure 42A:
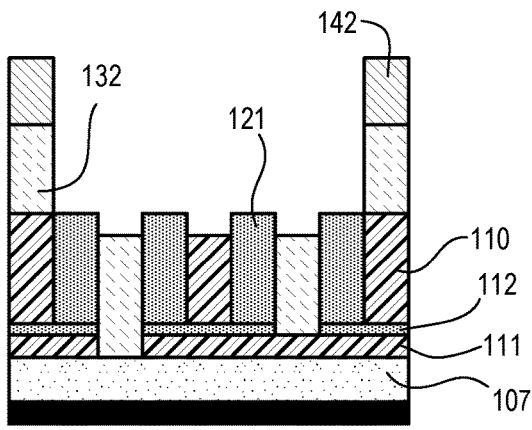
Figure 42B:
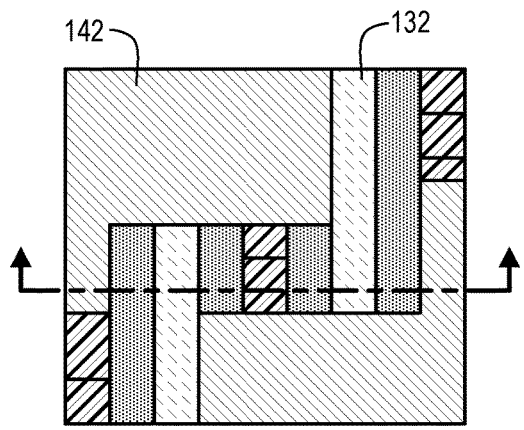
Figure 43A:
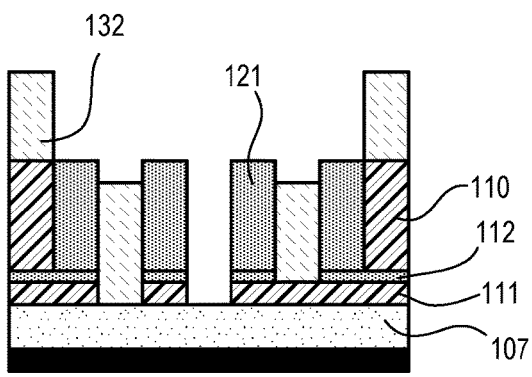
Figure 43B:
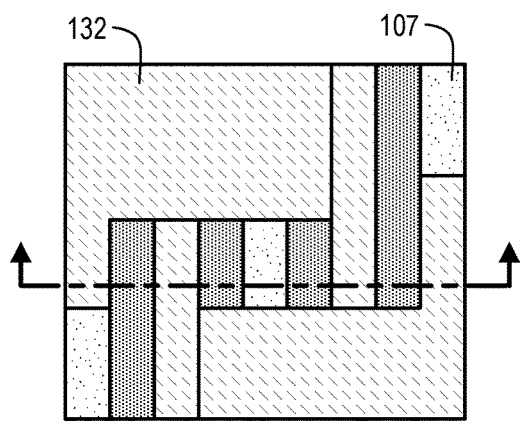
Figure 44A:
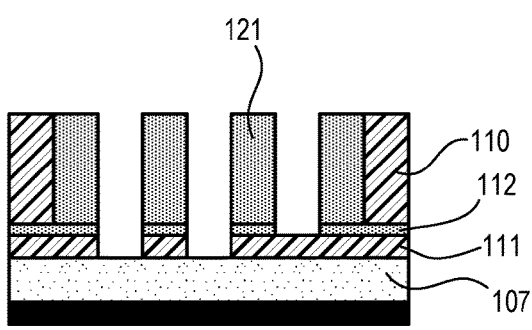
Figure 44B:
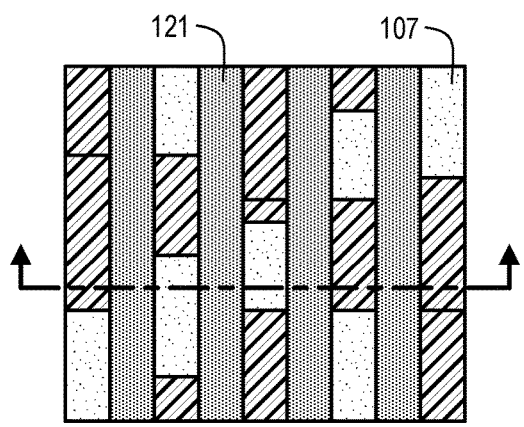

The substrate can be planarized with fill material 132, and then have a second etch mask 142 formed thereon, as in FIGS. 41A and 41B. Uncovered fill material 132 can be etched to uncover the multi-line layer as shown in FIGS. 42A and 42B. Next, optionally, uncovered mandrels 110 can be etched until uncovering the intermediate layer 112, then etching uncovered portions of the intermediate layer, then etching uncovered portions of the bottom layer 111 until the target layer 107 is uncovered. FIGS. 43A and 43B show an example result. Remaining fill material 132 and etch mask materials can be removed, as shown in FIGS. 44A and 44B.

Figure 45A:
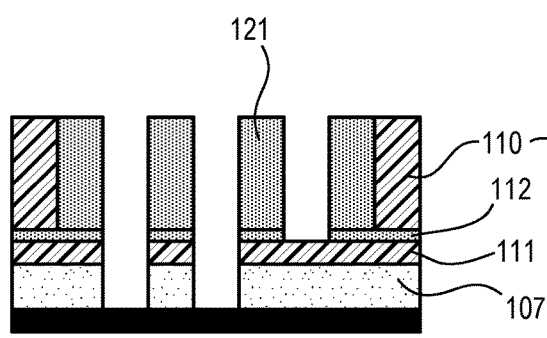
Figure 45B:
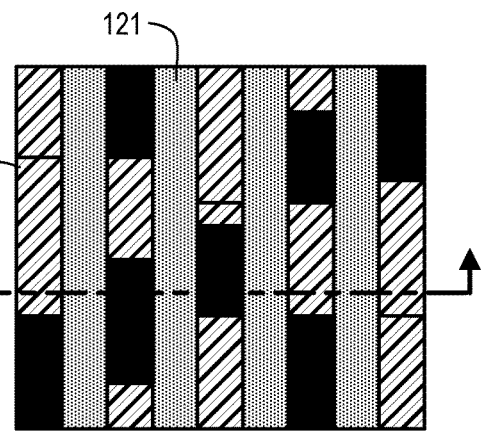
Figure 46A:
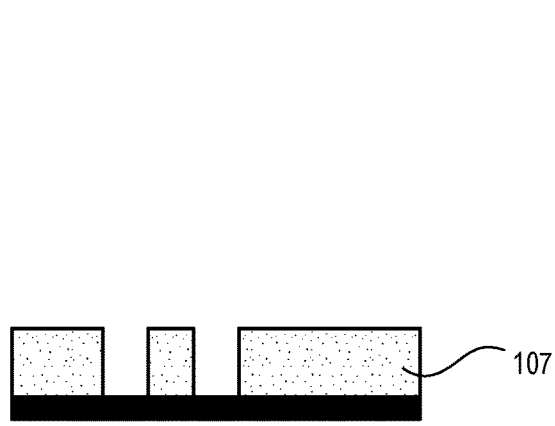
Figure 46B:
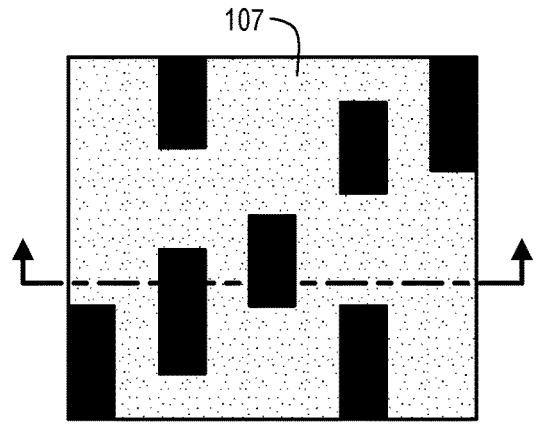

The remaining portions of the mandrels, the sidewall spacers, and the film of the first material, together form a combined relief pattern, which can be used as an etch mask to transfer into target layer 107 or other memorization layer. FIGS. 45A and 45B illustrate a result of etching uncovered portions of the target layer 107. FIGS. 46A and 46B then show a patterned target layer 107 after completing pattern transfer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
    forming mandrels on a target layer of a substrate, the mandrels being comprised of a first material, the target layer being comprised of a third material;
    forming sidewall spacers on sidewalls of the mandrels by depositing a conformal film on the substrate and removing portions of the conformal film above top surfaces of the mandrels while leaving the conformal film below top surfaces of the mandrels such that the sidewall spacers are formed on vertical sidewalls of the mandrels and such that the conformal film covers the target layer between adjacent sidewall spacers, the conformal film being comprised of a second material;
    forming a first etch mask on the substrate, the first etch mask defining openings that uncover regions of both the first material and the second material executing a first etch process that selectively etches uncovered portions of the second material until the conformal film covering the target layer between adjacent sidewall spacers is removed while the sidewall spacers remain on the substrate; and forming a second etch mask on the substrate, the second etch mask defining openings that uncover regions of both the first material and the second material; and executing a second etch process that selectively etches uncovered portions of the first material until uncovered mandrels are removed.

2. The method of claim 1, wherein forming the sidewall spacers includes depositing a second filler material on the substrate, the second filler material filling trenches defined by the conformal film; and executing a chemical-mechanical polishing step that removes conformal film material and second filler material above top surfaces of the mandrels.

3. The method of claim 2 further comprising removing the second filler material from the trenches defined by the conformal film.

4. The method of claim 1, wherein forming the sidewall spacers includes depositing a second filler material on the substrate, the second filler material filling trenches defined by the conformal film;

executing a third etching process that etches the second filler material until uncovering top surfaces of the conformal film;

executing a fourth etching process that etches the conformal film until uncovering top surfaces of the mandrels.

5. The method of claim 4, further comprising removing the second filler material from the substrate.

6. The method of claim 1, further comprising:

removing the first etch mask subsequent to executed the first etch process and prior to forming the second etch mask; and removing the second etch mask subsequent to executing the second etch process, remaining portions of the mandrels, the sidewall spacers, and the conformal film covers the target layer between adjacent sidewall spacers, together forming a combined relief pattern.

7. The method of claim 6, further comprising executing a fifth etch process that uses the combined relief pattern as an etch mask and transfers a corresponding pattern into the target layer.

8. The method of claim 1, wherein forming the first etch mask includes depositing a first filler material on the substrate that planarizes the substrate, wherein the first etch mask is formed on the first filler material, the first filler material comprised of a fourth material, wherein during the first etch process, the first material and the second material and the third material and the fourth material exhibit different etch resistivities relative to each other such that the mandrel formed of the first material is not etched, a height of the spacer sidewall formed of the second material is reduced, an exposed portion of the target layer formed of the third material is not etched, and uncovered portions of the first filler material formed of the fourth material are removed.

9. The method of claim 1, wherein forming the second etch mask includes depositing a second filler material on the substrate that planarizes the substrate, wherein the second etch mask is formed on the second filler material, the second filler material comprised of a fourth material, wherein during the second etch process, the first material and the second material and the third material and the fourth material exhibit different etch resistivities relative to each other such that the mandrel formed of the first material is removed, the spacer sidewall formed of the second material is not etch, an exposed portion of the target layer formed of the third material is not etched, and uncovered portions of the second filler material formed of the fourth material are not removed.

10. A method of patterning a substrate, the method comprising:

forming mandrels on a target layer of a substrate using a first etch mask, the mandrels being comprised of a first material, the target layer being comprised of a third material, wherein a film of the first material covers the target layer between the mandrels such that a top surface of the mandrels is greater in height as compared to a top surface of the film of the first material;

forming sidewall spacers on sidewalls of the mandrels, the sidewall spacers being comprised of a second material, the sidewall spacers defining open spaces between each other that leave the film of the first material uncovered;

depositing a fill material on the substrate that at least partially fills the open spaces defined between the sidewall spacers, the fill material being comprised of a fourth material, wherein the first material, the third material and the fourth material are all chemically different from each other;

forming a second etch mask on the substrate, the second etch mask defining openings that uncover portions of the top layer of the mandrels;

after forming the second etch mask, executing a first etch process that etches, using the second etch mask, the uncovered portions of the fill material and that etches uncovered portions of the top layer of the mandrels;

after executing the first etch process, forming a third etch mask on the substrate, the third etch mask defining openings that uncover regions of both the first material and the second material; and executing a second etch process, using the third etch mask, that selectively etches uncovered portions of the first material until uncovered mandrels are removed.

11. A method of patterning a substrate, the method comprising:

forming a tri-layer stack on a target layer, the tri-layer stack including a bottom layer, an intermediate layer, and an upper layer, each layer being deposited as a horizontal and homogeneous layer, the upper layer being comprised of a first material, the intermediate layer being comprised of a fifth material, the bottom layer being comprised of a sixth material, the target layer being comprised of a third material;

forming mandrels comprised of the first material by using a first etch mask and executing a first etch process that etches a mandrel pattern into the upper layer until uncovering the intermediate layer, the intermediate layer having a different etch resistivity as compared to the upper layer such that the intermediate layer provides an etch stop layer for the first etch process;

forming sidewall spacers on sidewalls of the mandrels, the sidewall spacers being comprised of a second material, the sidewall spacers defining open spaces between each other that leave the bottom layer uncovered;

forming a second etch mask on the substrate, the second etch mask defining openings that uncover regions of both the first material and the second material;

executing a second etch process, using the second etch mask, that selectively etches uncovered portions of the sixth material until the bottom layer covering the target layer between adjacent sidewall spacers is removed while the sidewall spacers remain on the substrate;

after executing the second etch process, forming a third etch mask on the substrate, the third etch mask defining openings that uncover regions of both the first material and the second material; and executing a third etch process, using the third etch mask, that selectively etches uncovered portions of the mandrels until uncovering the intermediate layer.

12. The method of claim 11, wherein executing the third etch process further includes, after the uncovered portions of the mandrels are selectively etched, then etching uncovered portions of the intermediate layer, and then etching uncovered portions of the bottom layer until uncovering the target layer, wherein during the third etch process, the first material and the second material exhibit different etch resistivities.

13. The method of claim 11, wherein during the second etch process, the first material and the sixth material exhibit a same etch resistivity.

14. The method of claim 11, wherein during the third etch process, the fifth material and the second material exhibit a same etch resistivity.

15. The method of claim 11, wherein the etch stop layer and the sidewall spacers are comprised of a same material.

* * * * *